US009822322B2

(12) United States Patent
Ramm et al.

(10) Patent No.: US 9,822,322 B2
(45) Date of Patent: Nov. 21, 2017

(54) MOLYBDENUM MONOXIDE LAYERS, AND PRODUCTION THEREOF USING PVD

(75) Inventors: Jurgen Ramm, Maienfeld (CH); Beno Widrig, Bad Ragaz (CH); Kerstin Glantz, Goldach (CH); Florian Seibert, Sevelen (CH)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 311 days.

(21) Appl. No.: 13/881,855

(22) PCT Filed: Oct. 6, 2011

(86) PCT No.: PCT/EP2011/004990
§ 371 (c)(1),
(2), (4) Date: Jul. 22, 2013

(87) PCT Pub. No.: WO2012/055485
PCT Pub. Date: May 3, 2012

(65) Prior Publication Data
US 2013/0303414 A1    Nov. 14, 2013

Related U.S. Application Data

(60) Provisional application No. 61/407,656, filed on Oct. 28, 2010.

(30) Foreign Application Priority Data

Dec. 8, 2010  (DE) .................. 10 2010 053 751

(51) Int. Cl.
*F16C 33/04* (2006.01)
*C08J 7/06* (2006.01)
(Continued)

(52) U.S. Cl.
CPC ....... *C10M 103/06* (2013.01); *C23C 14/0084* (2013.01); *C23C 14/024* (2013.01);
(Continued)

(58) Field of Classification Search
CPC ........... C10M 103/06; C10M 2201/053; C23C 14/228
(Continued)

(56) References Cited

U.S. PATENT DOCUMENTS

2006/0042728 A1    3/2006  Lemon et al.
2007/0003693 A1    1/2007  Lee et al.
(Continued)

FOREIGN PATENT DOCUMENTS

DE    296 20 687 U1    1/1997
DE    199 44 977 A1    4/2000
(Continued)

OTHER PUBLICATIONS

Suszko, et al., "The Role of Surface Oxidation in Friction Processes on Molybdenum Nitride Thin Films", Surface and Coatings Technology, Elsevier, Amsterdam, NL, vol. 194, No. 2-3, May 1, 2005, pp. 319-324.

*Primary Examiner* — Prem C Singh
*Assistant Examiner* — Francis C Campanell
(74) *Attorney, Agent, or Firm* — Pearne & Gordon LLP

(57) ABSTRACT

The invention relates to a coating comprising at least one molybdenum-containing layer having molybdenum oxide, said molybdenum being essentially molybdenum monoxide. The invention further relates to a PVD process for producing the disclosed coating, in which the layer comprising the molybdenum monoxide is produced using arc evaporation. The invention also relates to a component that has said coating.

17 Claims, 4 Drawing Sheets

Figure 1:
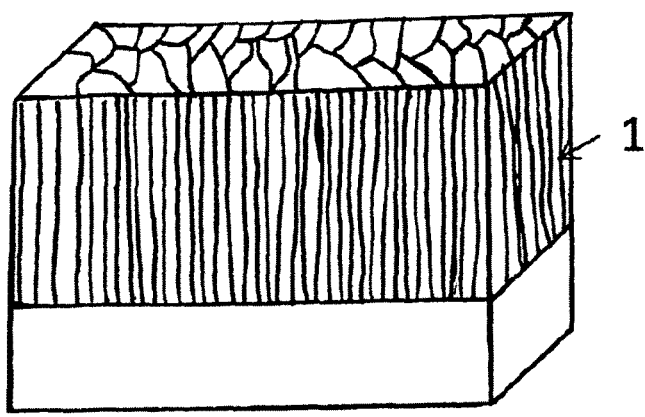

(51) Int. Cl.
*C10M 103/06* (2006.01)
*C23C 14/00* (2006.01)
*C23C 14/02* (2006.01)
*C23C 14/06* (2006.01)
*C23C 14/08* (2006.01)
*C23C 14/32* (2006.01)
*C23C 14/34* (2006.01)
*C23C 14/54* (2006.01)
*C23C 28/04* (2006.01)
*C23C 28/00* (2006.01)

(52) U.S. Cl.
CPC ........ *C23C 14/027* (2013.01); *C23C 14/0676* (2013.01); *C23C 14/08* (2013.01); *C23C 14/325* (2013.01); *C23C 14/3414* (2013.01); *C23C 14/548* (2013.01); *C23C 28/042* (2013.01); *C23C 28/044* (2013.01); *C23C 28/048* (2013.01); *C23C 28/322* (2013.01); *C23C 28/347* (2013.01); *C23C 28/3455* (2013.01); *C23C 28/36* (2013.01); *C23C 28/42* (2013.01)

(58) Field of Classification Search
USPC .......................................... 508/108; 427/497
See application file for complete search history.

(56) References Cited

U.S. PATENT DOCUMENTS

| | | |
|---|---|---|
| 2008/0179430 A1 | 7/2008 | Campion et al. |
| 2009/0256215 A1 | 10/2009 | Novak et al. |
| 2009/0269600 A1 | 10/2009 | Ramm et al. |
| 2010/0078314 A1 | 4/2010 | Taylor et al. |
| 2010/0167463 A1* | 7/2010 | Sung ........................... 438/104 |

FOREIGN PATENT DOCUMENTS

| | | |
|---|---|---|
| DE | 10 2006 036101 A1 | 2/2007 |
| EP | 1 146 140 A1 | 10/2001 |
| JP | 2006-255708 A | 9/2006 |
| SU | 1 832 751 A1 | 1/1998 |
| WO | 95/21994 A1 | 8/1995 |
| WO | 2010/020362 A1 | 2/2010 |

\* cited by examiner

MOLYBDENUM MONOXIDE LAYERS, AND PRODUCTION THEREOF USING PVD

The invention relates to the coating of components and tools that are required to exhibit enhanced sliding properties or that are used in tribological systems in which as a rule lubricants have to be used to reduce friction.

The invention furthermore relates to the coating of components or tools for which there is a risk that smearing might occur during contact with the counter body or with the material to be processed. Examples of these components are piston rings, piston surfaces, injection nozzles, slide bearings, gasket rings in engines as well as generally sliding elements and gear elements. Further examples of such tools are forming tools such as pressing tools in the aluminum processing industry or plastic processing industry as well as machining tools such as drills, mills and cutting inserts for the machining of aluminum, steels and various metal alloys as well as generally forming and cutting tools.

STATE OF THE ART

Based on the confirmed good properties of its compounds in particular with oxygen and nitrogen, molybdenum proves to be a very interesting element for generating different composite materials that can be used for example as protective coating against wear and tear or as lubricating materials.

It is thus for example known that the presence of molybdenum trioxide ($MoO_3$) can have an advantageous effect as intermediate material in tribological systems, i.e. a material provided between two bodies in friction against one another (such an intermediate material is usually provided as lubricant), because it causes a wear-reducing reduction of the tribological load (see for example DE102006036101 A1).

However, the production of molybdenum oxide layers in an economically sustainable way has thus far proven difficult, in particular, the production of molybdenum oxide as protective coatings against wear and tear by means of thin-film technology.

In DE102006036101 A1, a coating method is disclosed, indicated specifically for valve elements, which enables a durable solid lubricant on the basis of molybdenum to be implemented. For this, molybdenum particles were embedded in the weld seam in the frame of an electric arc welding process. When used as a valve element, molybdenum trioxide ($MoO_3$) is formed through post oxidation, as surmised by the authors of DE102006036101 A1 so that the lubrication properties were further improved.

US20090256215 discloses several methods for generating thin molybdenum oxide layers ($MoO_x$) for the production of gas sensors, in particular for fire detection devices on the basis of carbon monoxide (CO). According to the methods described, the object is first masked in a targeted fashion and coated with a Mo layer of 45 to 150 Å thickness by means of electron beam technology. Subsequently, the Molybdenum-coated object is annealed in air or controlled atmosphere during several days in order to enable the growth of $MoO_x$. The authors have reported particular advantages during the growth of the molybdenum oxide phase desired by them (the carbon monoxide-selective phase $\beta$-$MoO_{3-\delta}$), when the annealing takes place in an $O_2$ atmosphere at a pressure of 1.2-1.6 atm and at a temperature of 175-225° C. during 2-6 hours. The authors incidentally also mentioned that previously, for the same purpose, thin layers of molybdenum trioxide ($MoO_3$) with thicknesses of 200 to 400 nm were produced by means of Sol-Gel and RF magnetron sputtering processes.

In *Surface and Coatings Technology* 163-164 (2003) 413-421, $Cr_2$—$O_3$/$MoO_3$ layers produced by means of thermal spraying using powder mixtures of $Cr_2O_3$ and $MoO_3$ were discussed. According to the authors of the article, these layers exhibit an improved reduction of the friction by comparison with similarly produced $Cr_2O_3$ layers but without $MoO_3$.

In contrast to molybdenum oxide layers, the production and use of molybdenum nitride layers as protective coating against wear and tear have been better researched.

In *Journal of Materials Science Letters* 5 (1986) 255-256, the authors gave an account for example about the production of molybdenum nitride layers by means of plasma thermal spraying. The authors also commented incidentally that the examined production processes generated small quantities of molybdenum dioxide ($MoO_2$) as a by-product. It must however be noted that $MoO_2$ has a tetragonal or monoclinic structure and is accordingly very abrasive and thus not suitable for reducing friction (see e.g. *Surface and Coatings Technology* 163-164 (2003) 413-421).

Further known coating technologies for producing molybdenum nitride layers, and which are for example mentioned in *Surface and Coating Technology* 167 (2003) 77-82, are:
  ion beam-assisted processes
  physical vapor deposition resp. PVD processes such as e.g. sputter and spark evaporation
  nitrogen on implantation in surfaces already coated with molybdenum.

Various research papers relating to diffusion barrier, supra-conductor, catalytic and tribological properties of molybdenum nitride layers are also cited in the above mentioned publications. It is therefore to be inferred that molybdenum nitride can have specific physical, chemical and electrical properties depending on the achieved structure and that molybdenum nitride can be well suited in a wide range of applications.

Tests of phase compositions in Mo—N layers produced by means of spark evaporation have been described in *Surface and Coating Technology* 167 (2003) 77-82. In this connection, it has been observed that the phases in Mo—N layer systems produced by means of spark evaporation can be adjusted in a targeted fashion by varying the nitrogen pressure, substrate bias and substrate temperature.

DE19944977 B4 describes a method for increasing the boundary lubrication of low-alloyed steel with lubricated contacts in a fuel injection system. The method has the steps of preparing a low-alloyed steel substrate and then forming a metal nitride coating or a diamond-like carbon coating on the low-alloyed steel substrate, namely by using a physical vapor deposition resp. PVD process at low temperature. The authors also state that these coatings of fuel system components work to the effect that they improve the lubricity of certain fuels with low lubricity and thus reduce or minimize the need for adjuvant lubricants for the fuel compositions with lower lubricity. In terms of the method described above, the authors mention, among other nitrides, molybdenum nitride as a suitable nitride for the coating.

*Surface and Coatings Technology* 174-175 (2003) 713-719 reports that when PVD-produced molybdenum nitride layers are used in tribological applications and are thus, because of the friction subjected to oxidative conditions at high temperatures, the molybdenum nitride layers oxidize. The authors further show that when the molybdenum nitride layers oxidize, the properties of the oxidized layer surfaces start to dominate the friction and wear and tear mechanisms.

The coating with molybdenum also make it possible to have good sliding properties, as is disclosed in DE29620687 U1. This document describes a process for producing a coating for surgical instruments of steel. In order to produce the coating, the surgical Instrument is placed in a nitrogen atmosphere. In this nitrogen atmosphere, an electric light arc is generated and for this purpose electrodes of an alloy containing nitride formers are used. The electrodes evaporate in the light arc. The evaporating metal atoms are deposited onto the steel, where they combine with the nitrogen. The alloys used for the electrodes preferably contain titanium and/or chromium as well as aluminum. Titanium and/or chromium and/or if necessary molybdenum are preferably used as metallic nitride formers. For this purpose, a more or less large proportion of aluminum can preferably be added. The authors report that the coating thus produced has the following advantageous properties:

- extremely smooth surface and therefore particularly good sliding properties for cutting instruments
- high degree of hardness and thus increased resistance against mechanical damages
- good bonding between the coating and the steel through the infusion of the metals and of the nitrogen at the surface of the steel during evaporation. According to the authors, aluminum reacts particularly well with nitrogen, so that an infusion of nitrogen atoms also results in the steel surface and this leads to a good bonding between the coating the steel surface, which consequently leads to an increased hardening of the steel surface.
- high corrosion resistance, which according to the authors is caused in particular by titanium and chromium in the layer.

SU1832751 A1 discloses that when insufficient layer bonding of molybdenum nitride (No—N) layers to the substrate occurs, corresponding substrate pre-treatments for improving the layer bonding can be carried out.

In JP2006255708, Ishikawa comments on abrasion-resistant coatings that contain among others the following components:

- at least 15 atomic percent of silicium (of the metallic components)
- between 5 and 85 atomic percent of nitrogen (of the non metallic components)
- between 0.1 and 10 atomic percent of oxygen (of the non metallic components)

The following applications and production methods of layers containing molybdenum, in particular of layers containing MoN and molybdenum oxide, are furthermore known:

- fuel injection device with MoN coating (DE19944977 B4)
- injection system with MoN coating deposited by means of PVD techniques at 200° C. (US2010078314 A1)
- cylinder liner with thermal sprayed coatings having Mo and molybdenum oxide (WO9521994 A1)

It is interesting to bear in mind the post-oxidation effect shown in EP1783244. Yamamoto et al, report in this document about hard surface coatings for cutting and forming tools, comprising at least one nitride or nitride carbide layer containing molybdenum or tungsten and that are deposited by means of sputter and/or arc techniques and whose surfaces post-oxidize probably at temperatures close to the temperatures occurring close to the sliding surfaces. Yamamoto et al, mention her $MoO_2$ and $MoO_3$ as products of the post-oxidation of the Mo—N layers.

This post-oxidation effect however has the following disadvantages:

- On the one hand, it must be observed that the post-oxidation occurs in an uncontrolled manner, which causes both $MoO_3$ as well as $MoO_2$ to be generated. As already mentioned above, $MoO_2$ has abrasive properties that are very disadvantageous in connection with good sliding properties that might for example be required,
- During applications of Mo—N layers with high mechanical loading, on the other hand, both the reaction (post-oxidation of Mo—N) as well as the sliding properties of Mo—N in combination with the expected lubrication properties of $MoO_3$ are not stable, because the oxide compounds produced during the application, in particular $MoO_3$ particles continually break loose from the Mo—N layer. This quickly leads to a further oxidation of the Mo—N layer surface and, as the process progresses, to a degradation of the Mo—N layer.

TASK OF THE INVENTION

The present invention has the task of proposing an improved layer and a method for producing same, which in addition to other good tribological properties and/or electrical properties in particular also has good and stable lubrication properties and/or an improved smoothness and which preferably additionally also attenuates at least partially the above-mentioned disadvantages of the layers known so far.
Inventive Solution to the Task According to the invention, the task is solved by the production of a hard material layer comprising a stabile oxide of molybdenum.

In particular, the task is solved according to the invention by the production of a nitride oxide layer of molybdenum Mo—(N—O) comprising a stable oxide of molybdenum.

Furthermore, an inventive controlled PVD process is proposed that allows oxygen to be made to react in a targeted fashion with molybdenum so that a stable molybdenum oxide combination is formed in the layer.

In particular, an inventive controlled PVD process is furthermore proposed that allows oxygen to be integrated in a targeted fashion into the MoN essentially without $MoO_2$ and/or $MoO_3$ compounds being formed in the layer. Optionally, it is possible by means of the inventive process for a $MoO_3$ layer as solid lubricant to be deposited at the surface.

An inventive layer system according to a preferred embodiment comprises at least one of the following two layers with an oxygen concentration 0.03, and preferably comprises at least the two following layers:

- A first layer having in particular very high mechanical stability and containing $(Mo_{1-x}, Me_x) A_a B_b C_c$, wherein $0 \leq x \leq 0.99$, preferably $0 \leq x \leq 0.5$ and Me is a metal from the group of W, Ti, Al, Cr, Si, Zr, Ta, Nb, Ag, Cu and V or the combination of two or more metals of this group and
  A is nitrogen (N) with $0.5 \leq a \leq 1$
  B is carbon (C) with $0 \leq b \leq 0.5$
  C is oxygen (O) with $0 \leq c \leq 0.5$
  and wherein a, b and c indicate in at % between the elements N, C and O with $a+b+c=1$ and additional further elements can be provided but are preferably not provided.
- A second layer having in particular very good lubricating properties and sliding characteristics:

containing $(Mo_{1-y}, Me_y)\ A_uB_vC_w$, wherein $0 \leq y \leq 0.99$, preferably $0 \leq y \leq 0.5$ and Me is a metal from the group of W, Ti, Al, Cr, Si, Zr, Ta, Nb, Ag, Cu and V or the combination of two or more metals of this group and A is nitrogen (N) with $0.5 \leq u \leq 1$ B is carbon (C) with $0 \leq v \leq 0.5$ C is oxygen (O) with $0.5 \leq w \leq 1$ and wherein u, v and w indicate in at % between the elements N, C and O with $u+v+w=1$ and additional further elements can be provided but are preferably not provided.

Production of an inventive layer preferably takes place under process conditions for which during the PVD process for producing a PVD layer in a non-reactive gas atmosphere or in a reactive gas atmosphere (without adjunction of oxygen) gradually the reactive gas supplied in the chamber is partly replaced with the oxygen and thus molybdenum monoxide (MoO) is formed in the layer. The molybdenum required for producing the molybdenum monoxide (MoO) in the coating chamber is supplied from a target containing molybdenum and which is accordingly integrated in a PVD source, preferably in an arc evaporation source. The PVD source with the molybdenum-containing target must be activated at least shortly before the adjunction of oxygen in the coating chamber.

Molybdenum oxide (MoO) is advantageous compared with molybdenum dioxide ($MoO_2$) and molybdenum trioxide ($MoO_3$) in that:

MoO by opposition to $MoO_2$ is not abrasive

MoO, similarly to $MoO_3$, has very good sliding and lubricating properties but proves considerably more stable by comparison with $MoO_2$ and $MoO_3$ MoO is effective against smearing.

The process preferably takes place under process conditions for which in pure nitrogen atmosphere the hexagonal phase of molybdenum nitride (MoN) is produced but wherein, through the adjunction of oxygen, the nitrogen is gradually replaced partially by the oxygen and thus molybdenum monoxide is formed in the layer. Since molybdenum oxide (MoO) even in the case of mechanically challenging applications remains stable and present on the layer, ft prevents or inhibits an extensive post-oxidation of the MoN layer and thus also stabilizes the molybdenum nitride.

The inventive synthesized layers exhibit neither the typical molybdenum dioxide peaks nor the molybdenum trioxide peaks in the x-ray spectrum. These layers however show during analysis (e.g. in quantitative elemental analysis by means of Elastic Recoil Detection (ERD) of high-energy heavy ions) an oxygen content of more than 3 at % but less than 50 at %, if correlating the oxygen to the pure MoO monoxide.

For specific applications, further elements such as carbon (C), boron (B), silicium (Si), tungsten (W) or copper (CU) can be added to the molybdenum nitride oxide layer Mo—N—O.

For many types of steel, the problem arises that they smear on the surface of component elements or tools coated with conventional coatings such as e.g. TiAlN or CrAlN, which is an undesirable effect in particular for the machining of metals, such as for example turning, broaching or milling. The inventors have furthermore determined that the smearing of such types of steel is prevented at least for the most part through the coating with MoN by means of spark evaporation.

This also applies in particular when molybdenum nitride is integrated in suitable quantities into other nitrides. This means that the originally very good properties that the basis nitrides have, are preserved, but that additionally smearing can be prevented by adding molybdenum nitride. Here too, the depletion of the MoN through uncontrolled post-oxidation can be prevented or at least inhibited by replacing to a greater extent or completely MoN partly with MoO, preferably at the layer surface.

Furthermore, the inventors could produce for the first time by means of spark evaporation and pulsed spark evaporation relatively thick molybdenum-containing layers (>50 nm) with a higher concentration ($\geq 50$ at %) of molybdenum oxide.

The synthesis of the molybdenum nitride oxide layers Mo—N—O in a PVD process takes place through plasma-assisted reactive coating, for example by means of reactive spark evaporation, in that a cathodic spark on a molybdenum target is operated in nitrogen atmosphere between typically 0.1 Pa and 10 Pa. The adjunction of oxygen results in the formation of molybdenum oxide Mo—O compounds.

The known oxides that are formed from molybdenum, namely $MoO_2$ and $MoO_3$, have as described the property that they are readily volatile. It is known that $MoO_3$ sublimates at temperatures between 500° C. and 600° C., i.e. it transitions into the gaseous phase. In a reactive plasma, this transition into the gas phase takes place due to the high reactivity of the plasma at considerably lower substrate temperatures. This means that the transition is caused rather through the reactivity of the plasma than through the substrate temperature. This in turn means that the gaseous Mo—O compounds must be controlled very accurately so that the integration of the solid lubricant in the form of powdery molybdenum oxide ($MoO_2$ or $MoO_3$) during the layer deposition can be prevented.

For illustration purposes, this will be discussed using the example of some scanning electron microscope pictures (SEM images) of rupture cross-sections for Mo—N, Mo—O and Mo—N—O layers.

FIG. 1 is a sketch of a typical layer morphology for a molybdenum nitride layer MoN, which the inventors have produced by means of reactive spark evaporation.

The inventors have deposited a molybdenum nitride MoN onto a bonding layer of chromium nitride CrN (thickness of the bonding layer approx. 300 nm). The MoN layer was produced at a temperature of 450° C. with a Mo target and a spark current of 220 A. The nitrogen pressure was 3.5 Pa and a substrate bias of 20V was used.

The SEM image of the rupture cross-section shows a dense layer morphology. Hardness measurements yielded typical values of HV 3000±500. The layer showed in comparison with layers usually produced by means of spark evaporation an unusually low roughness of Rz=1.07 μm and Ra=0.13 μm.

Additionally, the friction coefficients of the deposited layers were determined. For this, a SRV test resp. a tribometer from the company Optimol Instruents Prüftechnik GmbH was used. When performing the SRV test, the two test objects mounted in the testing chamber (a sphere on a disk) were pressed onto one another with a prescribed force. During the measurement, the upper test object, in this case the counter body (an uncoated sphere of 100Cr6 steel) oscillated on the lower test object (the coated test disk). For the measurement, the frequency, glide path, test force, test temperature and test duration were pre-specified. During the measurement, the friction forces were recorded continuously by means of a sensor and the friction values thus computed automatically. The wear and tear occurring during the measurement on both test objects was also assessed after the measurement.

The measured friction coefficient and the observations with respect to the smearing of the used counter body of 100Cr6 steel on the test disks coated with MoN in the SRV test are indicated in table 1. For all measurements in the SRV test, the same parameters in terms of frequency, glide path, test force, test temperature and test duration were pre-specified. However, the measurements were performed after three different test procedures, as is also indicated in table 1.

Since for all measurements a counter body resp. a sphere of 100Cr6 steel was used, the appearance of smearings from the steel on the contact surface of the coated test disk was to be expected, as is usual under the predefined conditions. However, the inventors surprisingly observed that no smearing of the counter body on the surface of the test disks coated with MoN occurred.

TABLE 1 friction coefficients of the MoN layers produced by means of spark evaporation and observation of smearing of the counter body on the layers in the SRV test

| Different test procedures for the measurements in the SRV test | Measured friction coefficient [µm] | Smearing of 100Cr6 steel on MoN |
|---|---|---|
| dry running tests with coated test disk that have not been treated after the coating | ~0.6 | no smearing |
| dry running tests with coated test disks that have additionally been polished after coating | ~0.5 | no smearing |
| lubricated tests with coated test disks that have additionally been polished after coating | ~0.08 | no smearing |

Figure 4:
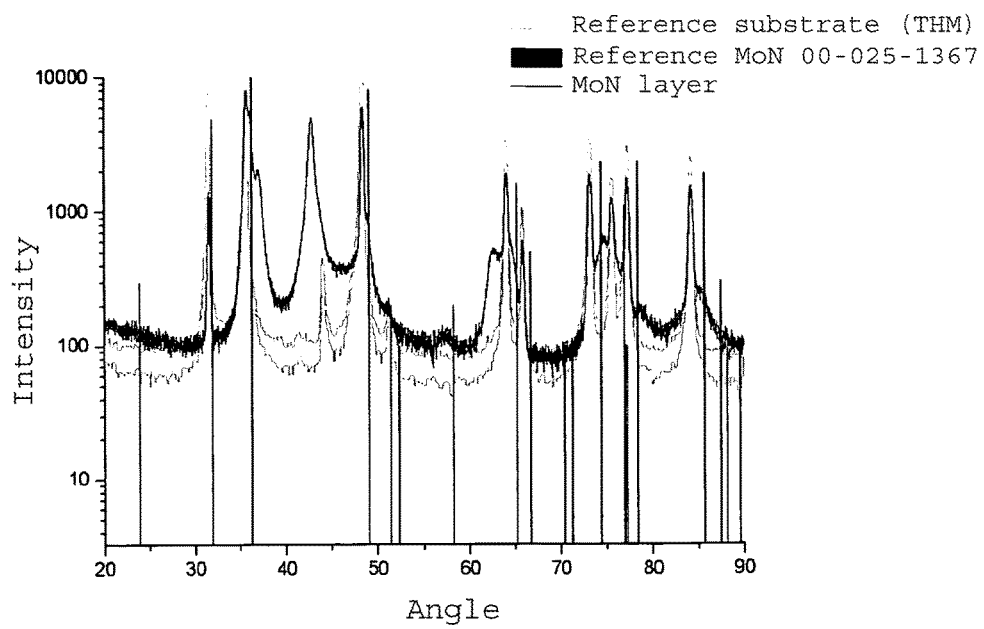

The x-ray diffraction (XRD) spectrum in FIG. 4 shows the typical Bragg reflexes for the MoN produced by means of spark evaporation.

Figure 2:
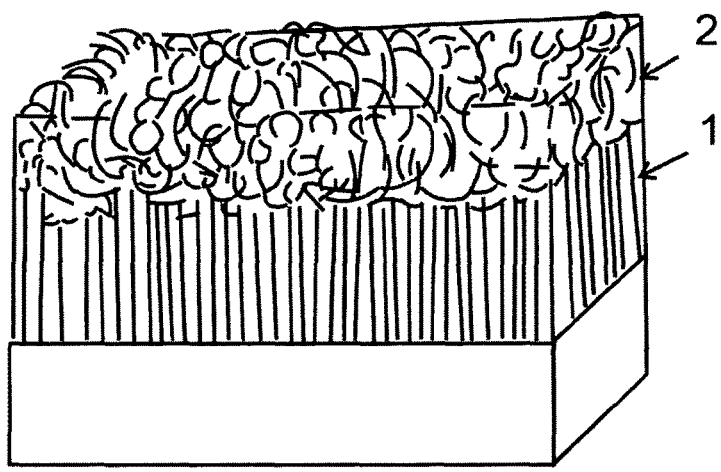

FIG. 2 shows the sketch of a layer of Mo—N—O deposited onto a CrN bonding layer. The Ma-N—O layer was produced on an approx. 300 nm CrN bonding layer under similar conditions to the MoN layers described above, at 450° C. substrate temperature and a spark current of 220 A. After a short phase of several minutes in pure nitrogen, oxygen was added to the process regulated to the nitrogen pressure of 3.5 Pa, with the oxygen flow being increased gradually rasp, linearly over approx. 2 h from 50 sccm to 800 sccm.

The SEM image of the rupture cross-section shows a clear transition to a loose layer construction in the last third of the layer (as sketched in FIG. 2).

The upper layer showed the loose deposited $MoO_3$ layer that has smearing properties but barely any mechanical resistance.

It will be obvious to the one skilled in the art that the integration of such a layer into a layer system will lead to bonding problems. The inventors ascribe this undesirable construction in the last third of the layer to the fast reaction of the molybdenum atoms in the coating chamber and even in the already produced MoN layer with the oxygen added in the coating chamber. This fast reaction, so the inventors surmise, promotes from a specific flow of oxygen onwards the formation of volatile molybdenum oxides such as $MoO_2$ and $MoO_3$ during coating.

This result therefore underlines the importance of preventing the sublimation of the $MoO_2$ and $MoO_3$ during coating, i.e. to control the flow of oxygen in such a manner that essentially not only volatile molybdenum oxides such as molybdenum monoxide (MoO) are integrated into the layer system.

It can however be advantageous according to the invention to work with a high oxygen flow until completion of the layer for molybdenum trioxide ($MoO_3$) to be formed at the layer surface and thus for a soft run-in layer to be generated, e.g. $MoO_3$ onto MoO.

Figure 5:
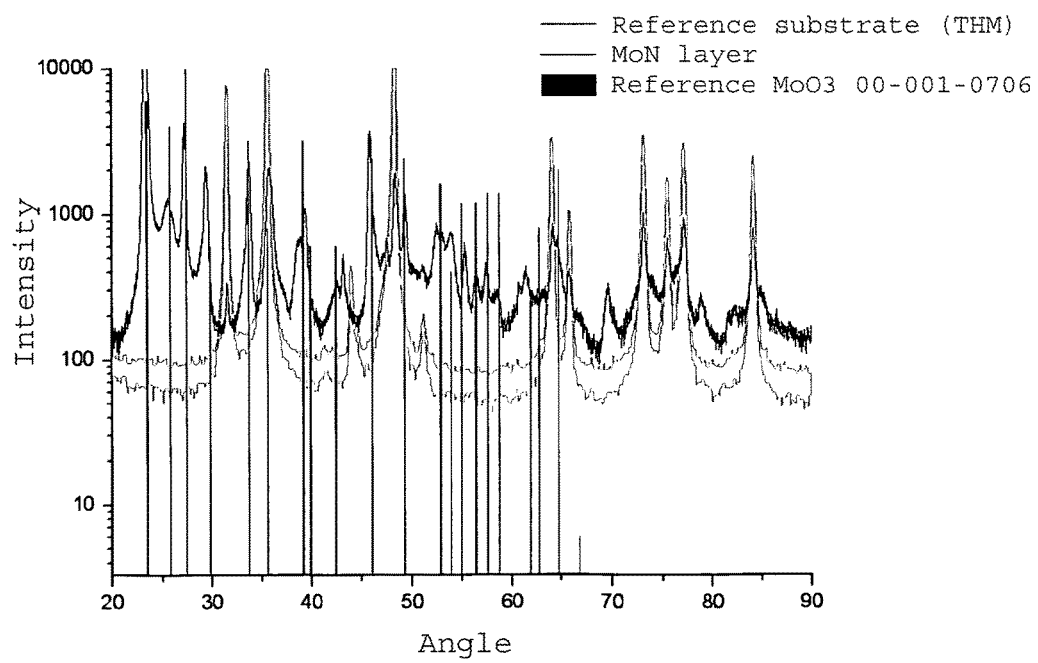

FIG. 5 shows the XRD spectrum generated by the x-ray diffraction analysis (XRD) of the Mo—O—N layer pictured in FIG. 2. The comparison with the reference from the ISDN database also confirms the formation of the $MoO_3$ which functions as a good solid lubricant.

For the layer sketched in FIG. 2, the surface roughness could no be determined since the upper part of the layer is too soft for reproducible measurements. The friction coefficient of the layers not subject to post-processing was again determined in the SRV test. The SRV tests were performed in dry-run and with the same test parameters as mentioned above. These layers were not subsequently polished in order to avoid a possible loss of the $MoO_3$ layer at the coating surface before the start of the SRV test.

The friction coefficient of these layers as measured in this way was 0.75, which is surprisingly higher than the friction coefficient of the pure MoN layers which were characterized in exactly the same test conditions (same test parameters and same testing procedure) in the SRV test. The inventors conjecture that this unexpected result is due to the possibly integration of molybdenum dioxide ($MoO_2$) in the Mo—N—O. As is known in the literature and has already been mentioned above, $MoO_2$ is strongly abrasive. How the formation of $MoO_2$ can be avoided in the inventive production process will be described further below.

Figure 3:
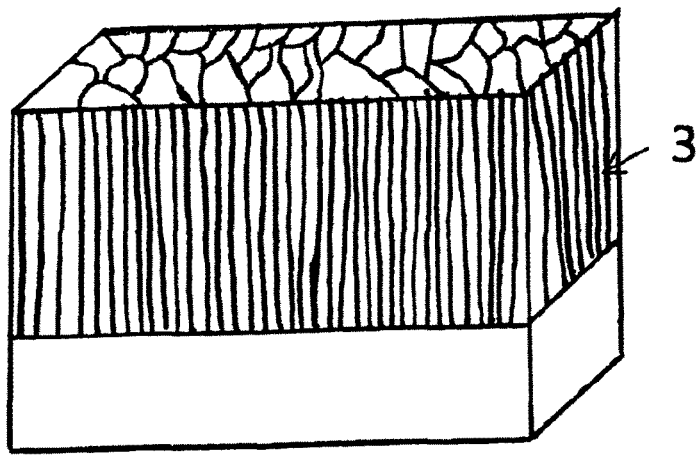

FIG. 3 is a sketch of the SEM layer cross-section of a layer produced according to the invention with controlled oxygen content. The layer showed a clearly different morphology as that of the layer sketched in FIG. 2. The morphology of the inventively produced layer with controlled oxygen content resembles that of the MoN, although a proportion of more than 5 at % oxygen in the layer can be evidenced by means of energy-dispersive X-ray microanalysis (EDX).

The production process performed according to the invention essentially results only in a phase formation of the molybdenum monoxide (MoO) in the MoN layer, wherein the atomic concentration of the oxygen in the $Mo_z(N_dO_e)$ layer lies between a value of e=0.03 and 1 under the condition z≥d+e, with d, e and z at %.

The proportion z−(D+y) of Mo then corresponds to the molybdenum that has not reacted with nitrogen and/or oxygen. This occurs for example during spark evaporation in the form of conglomerates integrated into the layer that arise from molybdenum that has not fully reacted and that are known in professional circles as droplets.

The layer sketched in FIG. 3 was deposited without bonding layer. For the deposition of this inventive layer, 2 molybdenum targets were used that were operated both with 220 A spark current. The coating process was set to a constant total pressure of 4 Pa, which was established first by letting in nitrogen into the coating chamber. The process parameters were varied during the entire deposition process in an alternating and continuous fashion, by adding to the regulated total pressure an oxygen flow of 50 sccm each time over 40 s and subsequently interrupting again the oxygen flow for 3 min until the full layer thickness has been reached.

By means of energy-dispersive X-ray microanalysis (EDX), it has been established that the inventive layers thus deposited exhibit a proportion of more than 10 at % of oxygen.

However, no distinctive molybdenum dioxide or molybdenum trioxide peaks could be detected in the XRD spectrum of this layer (see FIG. 6), though they are however to be seen in FIG. 5.

It is thus shown that the Mo—O layers produced with spark evaporation can be controlled over the oxygen flow in such a way that the stable and ductile MoO (molybdenum monoxide) can be produced and be integrated into a MoN matrix or also be synthesized as individual layer. The transition to $MoO_3$ with or with very little integration of the abrasive $MoO_2$ into the layer can be achieved in a fast oxide ramp and the production of a solid surface lubrication is thus possible in the same process.

As already mentioned above, an outer $MoO_3$ layer produced in this way is particularly well suited as run-in layer.

Thanks to the flexibility of the inventively used spark evaporation and pulsed spark evaporation processes, the inventive MoO layers can also be integrated into any kind of layer. The MoO layers and $MoO+MoO_3$ layers using $MoO_3$ as run-in layer are integrated in particular as outer layers in order to be able to achieve a specific softness or an improved run-in behavior by comparison with the original layer system, in order for example to minimize the wear and tear of counter bodies in a tribological system and simultaneously have a stabilized oxidation behavior of layers containing molybdenum.

The integration of MoO in any kind of layer and in particular in other oxide layers such as Al—O, CrO, Zr—O, Ti—O and/or also in mixed oxide layers such as (Al, Cr)O, (Zr, Cr)O or Cr—O is also advantageous, e.g. to adjust smoothness.

For this, the reactivity of the other elements towards the oxygen must be observed very carefully. It is for example possible, through different tests each with incrementally increased oxygen flow, to analyze from which oxygen flow onwards molybdenum dioxide and molybdenum trioxide are formed in the layer. If during the coating process itself the lower oxygen flows are chosen, the formation of the undesirable molybdenum oxides is prevented.

As the inventors were able to determine, it is particularly advantageous to provide a layer containing MoN between the MoO layer and the substrate. This also contributes to further improving the mechanical stability of the layer in terms of hardness and bonding within the layer.

It can then be advantageous to provide, in addition to the molybdenum, further other metal components in the layer.

One particularly preferred embodiment of the invention is the production of a Mo—N—O layer by means of spark evaporation and/or pulsed spark evaporation, which can be produced for example as follows:

After letting in nitrogen into the coating chamber, a spark is ignited in the nitrogen atmosphere on a molybdenum target serving as cathode, which causes the evaporation of molybdenum and/or already reacted molybdenum nitride. After reaching a particular layer thickness, a little oxygen is additionally let into the coating chamber and thus a Mo—N—O layer is produced which has the very good properties of Mo—N but additionally, due to the small quantities of Mo—O compounds but into the layer, also procures improved lubricating properties and/or smoothness.

After letting in nitrogen into the coating chamber, a spark is ignited in the nitrogen atmosphere on a molybdenum target serving as cathode, which causes the evaporation of molybdenum and/or already reacted molybdenum nitride. After reaching a particular layer thickness, a little oxygen is additionally let into the coating chamber and after a certain time interval, the oxygen flow is interrupted again, so that only molybdenum nitride is produced again. The coating process is thus continued in this alternating manner until the desired total layer thickness of the multi-layer coat Mo—N/Mo—N—O/ Mo—N/Mo—N—O . . . is achieved. The thickness of the individual layers as well as the total coating thickness are adapted to the field of application. With this variant embodiment it is also possible to combine in a single coating the very good properties of Mo—N and the lubricating properties and/or smoothness of Mo—O.

Similar layer systems can also be produced with alloyed targets of Mo in combination with other metals or by activating resp. evaporating, in addition to the Mo target or the Mo targets, also targets of other metals and/or alloys and/or of other materials during the coating process.

In order to produce similar layer systems as the ones already mentioned above but with particular mechanical properties, the inventors have also provided for inventive layer systems that comprise carbide. These layer systems are also produced by means of spark evaporation and/or pulsed spark evaporation by letting in additionally a gas containing carbon during the coating procedure and/or by activating resp. evaporating carbon targets and/or targets containing carbon.

In general terms, there is an inventive layer system according to a particularly preferred embodiment if at least two layers comprise:
a first layer having as main component MoN and thus exhibiting very good mechanical stability, and
a second layer having molybdenum monoxide as main component and thus exhibiting very good lubricating properties.

The transition between the first and the second layer can be designed to be gradual.

An essential improvement of the toughness is achieved by depositing multi-layer coatings. Simultaneously, it is possible in this manner to prevent crack propagation from the surface to the basic material. Furthermore, the maximum layer thickness can be increased in many cases since internal mechanical stresses in the layer can be reduced with the multi-layer structure as compared with a monolayer coating.

In order to ensure a good cohesiveness within the entire coating, a corresponding adaptation of the material properties of the individual layers is required. This can be achieved for example by generating graded boundary/transition layers or by depositing intermediate layers.

DETAILED DESCRIPTION OF THE INVENTION ON THE BASIS OF EXAMPLES

The following examples serve to present the invention in detail, they are now however to be considered a limitation of its scope.

Example 1

It is generally advantageous for piston rings and shaft seal rings to exhibit good mechanical stability and simultaneously good lubricating properties and/or smoothness. In the present example, a piston ring of stainless steel was coated with Mo—N by means of spark evaporation. For this, the piston ring is placed in the coating chamber of a coating facility. The coating chamber is evacuated and, in order to clean/activate the surface, the surface is heated and etched before the coating procedure. After letting in nitrogen into the coating chamber, a spark is ignited in the nitrogen atmosphere on a molybdenum target serving as cathode, which results in the evaporation of molybdenum and/or already reacted molybdenum nitride. The deposition of the material onto the piston surface results in the formation of a 2 μm thick Mo—N layer. The coating process enables the coating thickness to be adapted depending on the application.

The inventive coating of pistons with Mo—N by means of spark evaporation has led the inventors to the observation that the friction during the operation is considerably reduced and also the service life of the piston ring is considerably increased. The inventors ascribe the reduced friction among others to the spatterings or droplets but into the layer by the spark evaporation. These spatterings or droplets are numerically so few that they do not essentially impair the stability and thus the hardness of the Mo—N layer yet are present in such numbers that the molybdenum thus available further improves, thanks to its lubricating properties, the already good sliding properties of the Mo—N layer which is smooth due to the production process.

A particular advantage of spark evaporation is the possibility of coating functional surfaces of precision components since the layer thickness can be deposited exactly according to the required precision reap. the requirements in the tribological system.

If for the above mentioned coating method pulsed technology is used, the growth of different phases of Mo—N can be very well regulated by adjusting different pulse parameters when applying a pulsed bias voltage and/or when operating a pulsed spark evaporation source. This makes it possible, by a specific adjustment of the coating parameters and especially of the pulse parameters, to promote the growth of a particular phase and to produce Mo—N layers with particular properties, adapted to the use of the coated component, R is also possibly, by varying the coating parameters during the coating process, to build for example also in an alternating fashion multi-layer Mo—N layers with different phases. In particular, a layer system can thus be achieved in which cubic Mo—N alternates with hexagonal Mo—N. Such a layer system, which comprises at least two layers, then includes at least one cubic and thus hard layer and an outer hexagonal and thus softer layer.

Figure 7A:
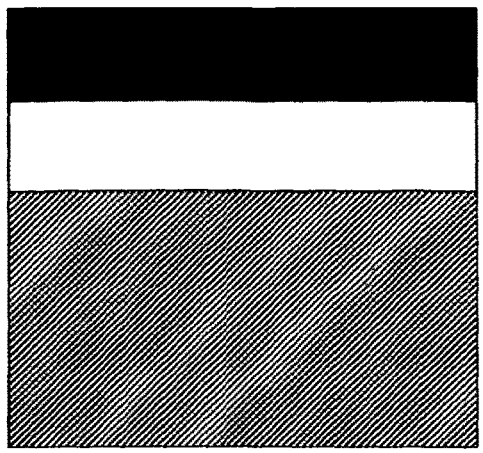

According to a further embodiment of the present invention, a two-layer coating system can be deposited onto the function surface resp. onto the substrate 1, e.g. for particularly heavy-duty pistons in combustion engines or also in order to be able to dispense with external intermediates: the first layer is then a Mo—N layer and the second layer is a molybdenum monoxide layer 9, as represented in FIG. 7*a*.

Figure 7B:
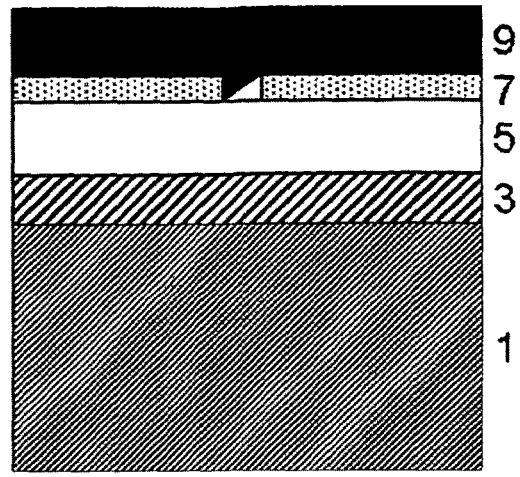

Here too, as already described further above, an additional bonding layer can be provided, as shown in FIG. 7*b*. The bonding layer 3 is provided between the substrate 1 and the first layer 5 in the layer system. The bonding layer can be both a pure metal layer (such as for example Cr, Mo, Ti, Si) or also a composite (such as for example Me-N or Me-NC), wherein Me can also be a combination of metals.

The transition between the first layer 5 and the second layer 9 can be designed as a gradient in such a manner that with increasing distance from the surface of the substrate, the Mo—N concentration diminishes and simultaneously the Mo—O concentration increases. This results in a very good adhesive strength within the layer system. This applies accordingly for all layer transitions of the layer systems mentioned in this description. The gradient can in particular comprise the entire layer and/or the entire layers.

A further improvement of the toughness in the layer system can be achieved by the deposition of several nano-layer coatings or by producing nano-composite structures, for example by embedding the harder phase in the form of nano-grains in a matrix from the softer phase.

One speaks of X-layer, in the frame of the present description, when the layer contains predominantly X, wherein X can be an elementary material or a compound.

In the frame of the present description, a coating has been disclosed which comprises at least a layer containing molybdenum and which is characterized in that the molybdenum is essentially molybdenum monoxide.

The inventive coating can contain for example a molybdenum oxide layer comprising essentially molybdenum monoxide. A MoO layer can be distinguished from $MoO_2$ and $MoO_3$ layers in that for example the XRD spectrum of the molybdenum monoxide layer (MoO) exhibits essentially neither $MoO_2$ peaks nor $MoO_3$ peaks.

A preferred embodiment of the inventive coating can for example additionally also comprise a molybdenum nitride layer.

The inventive coating can also contain a Mo—N—O layer comprising molybdenum-nitrogen compounds and molybdenum-oxide compounds, wherein essentially the molybdenum atoms build a compound with maximum one oxygen atom and wherein molybdenum monoxide is preferably comprised in the coating.

A preferred embodiment of the inventive coating with at least one Mo—N—O layer is characterized in that the Mo—N—O layer lies between a molybdenum nitride layer and a molybdenum monoxide layer.

The atomic concentration ratio in the Mo—N—O layer can be described by the following formula: $Mo_z(N_d O_e)$, wherein:
e: is the atomic oxygen concentration in the Mo—N—O layer
d: is the atomic nitrogen concentration in the Mo—N—O layer
z: is the atomic molybdenum concentration in the Mo—N—O layer and $z \geq y$.

The Mo—N—O layer can also be a graded layer, wherein the oxygen concentration decreases from the boundary surface close to the substrate towards the boundary surface close to the surface of the Mo—N—O layer whilst the nitrogen concentration increases.

An inventive coating can also be deposited as a multi-layer coating system, wherein several MoN and MoO layers are deposited in alternating fashion and can also contain several Mo—N—O layers that lie for example between the MoN and MoO layers and that can be deposited as graded layers with adapted variations of the nitrogen and oxygen concentrations to improve the adhesive strength within the layer.

The inventive coating can also additionally include a cover layer with $MoO_3$ if the $MoO_3$ produces significant advantages for the specific application.

According to the invention, the coating can also include one or several bonding layer(s) and/or functional layer(s) between the base body and the layer containing Mo.

An also preferred variant embodiment of the invention is a coating that comprises at least one layer containing Mo and having in particular very high mechanical stability and containing $(Mo_{1-x}, Me_x) A_a B_b C_c$, wherein $0 \leq x \leq 0.99$, preferably $0 \leq x \leq 0.5$ and Me is a metal from the group of W, Ti, Al, Cr, Si, Zr, Ta, Nb, Ag, Cu and V or the combination of two or more metals of this group and A is nitrogen (N) with 0.5≤a≤1
B is carbon (C) with 0≤b≤0.5
C is oxygen (O) with 0≤c≤0.5
and wherein a, b and c indicate in at % between the elements N, C and O with a+b+c=1 and additional further elements can be provided but are preferably not provided, and x≥c.

A preferred variant embodiment of the invention is also a coating that comprises at least one layer containing Mo and having in particular very good lubricating properties and sliding characteristics and containing $(Mo_{1-y}, Me_y)A_uB_vC_w$, wherein 0≤y≤0.99, preferably 0≤y≤0.5 and Me is a metal from the group of W, Ti, Al, Cr, Si, Zr, Ta, Nb, Ag, Cu and V or the combination of two or more metals of this group and A is nitrogen (N) with 0.5≤u≤1
B is carbon (C) with 0≤v≤0.5
C is oxygen (O) with 0.5≤w≤1
and wherein u, v and w indicate in at % between the elements N, C and O with u+v+w=1 and additional further elements can be provided but are preferably not provided, and y≥w.

Preferably, a coating could also be structured according to the invention to comprise:
at least a first MoN-containing layer and thus exhibiting in particular very good mechanical stability (according to the $(Mo_{1-x}, Me_x)A_aB_bC_c$ layer described above), and
at least a second layer exhibiting in particular very good lubricating and sliding properties (according to the $(Mo_{1-y}, Me_y)A_uB_vC_w$ layer described above).

A preferred variant of the method for producing the inventive coating is a PVD process or combined PVD/CVD process, wherein the molybdenum monoxide is deposited in the molybdenum-containing layer by means of spark evaporation.

A further preferred variant of the method for producing the inventive coating is a PVD process, wherein the molybdenum-containing layers are produced by means of spark evaporation of at least one target containing molybdenum in a reactive atmosphere.

As material source for the layers containing molybdenum, both molybdenum targets as well as alloyed molybdenum-containing targets are used that are produced for example by metallurgical smelting or powder-metallurgically.

Components can be coated depending on the application with the most suitable variant of the inventive coating.

In particular, machining tools and forming tools that are coated according to the invention for the production of components of metal or metal alloys, in order to reduce or preferably completely prevent smearings of the machined metals or metal alloys on the coated surface of the tool.

ILLUSTRATIONS

FIG. 1: sketch of the layer morphology of a MoN layer deposited by means of spark evaporation with CrN bonding layer in SEM rupture cross-section.

FIG. 2: sketch of the layer morphology of a Mo—N/Mo—N—O/Mo—O layer with CrN bonding layer in SEM rupture cross-section, wherein the molybdenum oxide phases $MoO_2$ and $MoO_3$ can be evidenced in the layer by XRD.

FIG. 3: sketch of the layer morphology of a Mo—N/Mo—N—O/Mo—O layer produced according to the invention by means of spark evaporation without bonding layer, in SEM rupture cross-section, wherein no molybdenum oxide phases $MoO_2$ and $MoO_3$ can be evidenced in the layer by XRD, although more than 10 atomic percent oxygen can be evidenced in the layer by EDX. The layer was produced by the adjunction, interrupted at time intervals, of an oxygen flow of 50 sccm (at 4 Pa set pressure) with an on-time of 40 s and an off-time of 3 minutes.

FIG. 4: Typical XRD spectrum of a MoN layer, whose Bragg reflexes are in conformity with the MoN reference ISDN 00-025-1367.

FIG. 5: Typical XRD spectrum of a $MoO_3$ layer, whose Bragg reflexes are in conformity with the $MoO_3$ reference ISDN 00-001-0706.

Figure 6:
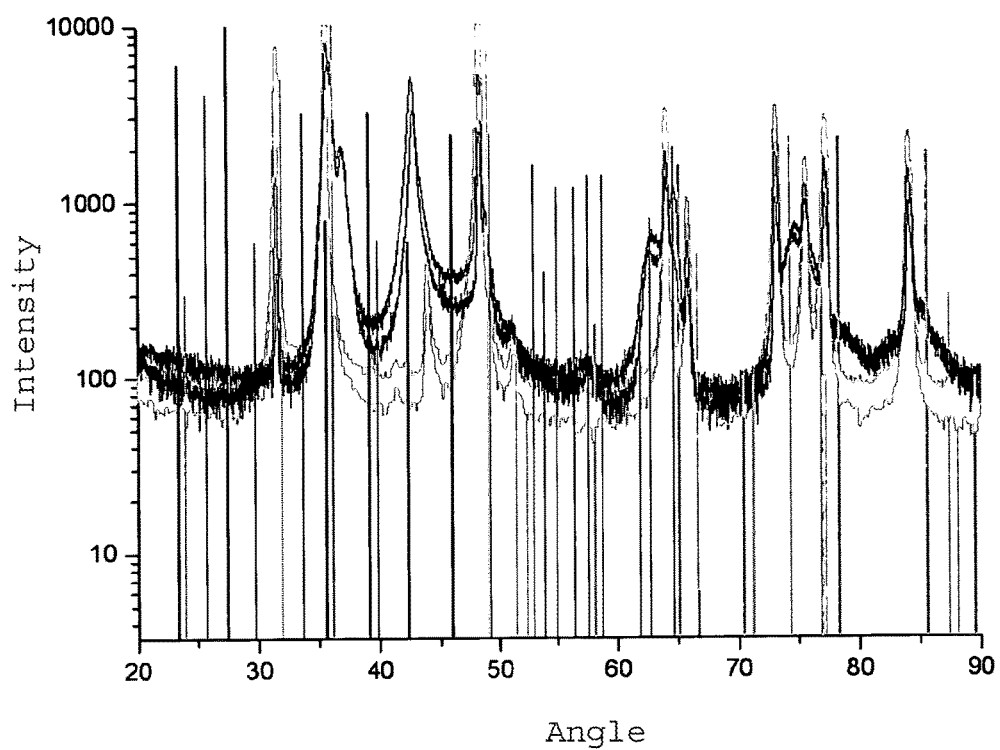

FIG. 6: Typical XRD spectrum of a molybdenum monoxide layer.

Figure 7C:
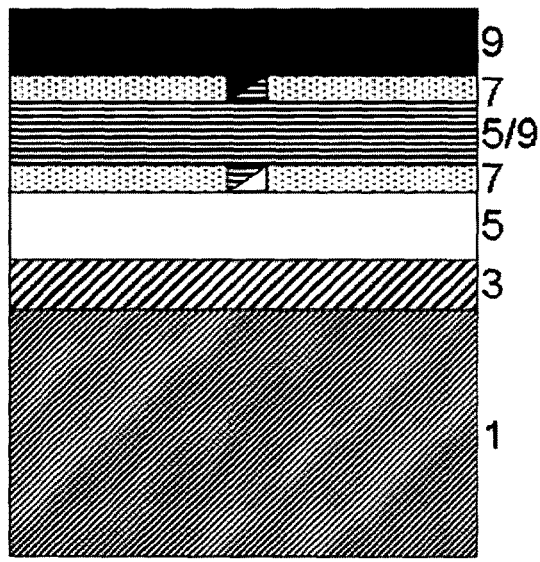

FIGS. 7a-7c: Layers in coating systems according to the invention.

REFERENCE LIST

1: substrate
3: bonding layer and/or functional layer
5: first layer
7: transition layer
9: second layer

What is claimed is:
1. Coating comprising:
at least one layer containing molybdenum oxide, characterized in that the molybdenum oxide consists essentially of a molybdenum monoxide,
at least one molybdenum nitride layer, and
at least one Mo—N—O layer including molybdenum-nitrogen compounds and molybdenum-oxide compounds.

2. Coating according to claim 1, characterized in that the XRD spectrum of the molybdenum monoxide layer essentially exhibits neither $MoO_2$ peaks nor $MoO_3$ peaks.

3. Coating according to claim 1, characterized in that the Mo—N—O layer lies between a molybdenum nitride layer and a molybdenum monoxide layer.

4. Coating according to claim 1, characterized in that the atomic concentration ratio in the Mo—N—O layer is described by the following formula, $Mo_z(N_dO_e)$, wherein:
e: is the atomic oxygen concentration in the Mo—N—O layer
d: is the atomic nitrogen concentration in the Mo—N—O layer
z: is the atomic molybdenum concentration in the Mo—N—O layer and z≥e.

5. Coating according to claim 1, characterized in that the Mo—N—O layer is a graded layer, wherein the nitrogen concentration decreases from the boundary surface close to the substrate towards the boundary surface close to the surface of the Mo—N—O layer whilst the oxygen concentration increases.

6. Coating according to claim 1, characterized in that the Mo—N—O layer is a graded layer, wherein the oxygen concentration decreases from the boundary surface close to the substrate towards the boundary surface close to the surface of the Mo—N—O layer whilst the nitrogen concentration increases.

7. Coating according to claim 5 or 6, characterized in that the coating comprises at least one coating according to claim 5 and at least one coating according to claim 6.

8. Coating according to claim 1, characterized in that the coating has a cover layer with $MoO_3$.

9. Coating according to claim 1, characterized in that at least one bonding layer and/or at least one functional layer is deposited between a base body and the layer containing Mo.

10. Coating according claim 1, characterized in that at least one layer containing Mo comprising $(Mo_{1-x}, Me_x) A_aB_bC_c$, wherein $0 \leq x \leq 0.99$ and Me is a metal from the group of W, Ti, Al, Cr, Si, Zr, Ta, Nb, Ag, Cu and V or the combination of two or more metals of this group and A is nitrogen (N) with $0.5 \leq a \leq 1$
B is carbon (C) with $0 \leq b \leq 0.5$
C is oxygen (O) with $0 \leq c \leq 0.5$ and wherein a, b and c indicate in at % between the elements N, C and O with $a+b+c=1$, and $x \geq c$.

11. Coating according to claim 1, characterized in that at least one layer containing Mo comprising $(Mo_{1-y}, Me_y) A_uB_vC_w$, wherein $0 \leq y \leq 0.99$ and Me is a metal from the group of W, Ti, Al, Cr, Si, Zr, Ta, Nb, Ag, Cu and V or the combination of two or more metals of this group and A is nitrogen (N) with $0.5 \leq u \leq 1$
B is carbon (C) with $0 \leq v \leq 0.5$
C is oxygen (O) with $0.5 \leq w \leq 1$ and wherein u, v and w indicate in at % between the elements N, C and O with $u+v+w=1$, and $y \geq w$.

12. Coating according to claims 10 and 11, characterized in that the coating comprises at least one first layer according to claim 10 and a second layer according to claim 11.

13. Component with a coating, characterized in that the coating is a coating according to claim 1.

14. Coating according to claim 1, wherein the molybdenum monoxide is contained in the coating.

15. Coating according to claim 10, wherein $0 \leq x \leq 0.5$.

16. Coating according to claim 11, wherein $0 \leq y \leq 0.5$.

17. Coating comprising:
at least one molybdenum nitride layer,
at least one Mo—N—O layer formed on the at least one molybdenum nitride layer, the at least one Mo—N—O layer including molybdenum-nitrogen compounds and molybdenum-oxide compounds, and
at least one molybdenum oxide formed on the at least one Mo—N—O layer, wherein the molybdenum oxide consists essentially of a molybdenum monoxide.

* * * * *

UNITED STATES PATENT AND TRADEMARK OFFICE
CERTIFICATE OF CORRECTION

PATENT NO. : 9,822,322 B2
APPLICATION NO. : 13/881855
DATED : November 21, 2017
INVENTOR(S) : Jurgen Ramm et al.

Page 1 of 1

It is certified that error appears in the above-identified patent and that said Letters Patent is hereby corrected as shown below:

In the Specification

Column 4, Line 51, replace "concentration 0.03," with -- concentration $\geq 0.03$, --.

Signed and Sealed this
Twenty-fourth Day of July, 2018

Andrei Iancu
*Director of the United States Patent and Trademark Office*